United States Patent
Mehrotra et al.

(10) Patent No.: US 6,743,705 B2
(45) Date of Patent: Jun. 1, 2004

(54) TRANSISTOR WITH IMPROVED SOURCE/DRAIN EXTENSION DOPANT CONCENTRATION

(75) Inventors: Manoj Mehrotra, Plano, TX (US); Haowen Bu, Plano, TX (US); Amitabh Jain, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/287,979

(22) Filed: Nov. 5, 2002

(65) Prior Publication Data

US 2003/0109105 A1 Jun. 12, 2003

Related U.S. Application Data

(60) Provisional application No. 60/338,109, filed on Dec. 6, 2001.

(51) Int. Cl.$^7$ .......................................... H01L 21/4763
(52) U.S. Cl. ........................................ 438/595; 438/663
(58) Field of Search ............................ 438/197, 204, 438/229, 311, 299, 300, 301, 339, 595, 680

(56) References Cited

U.S. PATENT DOCUMENTS

| | | | | |
|---|---|---|---|---|
| 5,075,241 A | * | 12/1991 | Spratt et al. | 438/663 |
| 5,908,313 A | * | 6/1999 | Chau et al. | 438/299 |
| 6,136,636 A | * | 10/2000 | Wu | 438/231 |
| 6,214,662 B1 | * | 4/2001 | Sung et al. | 438/241 |
| 6,350,665 B1 | * | 2/2002 | Jin et al. | 438/585 |

* cited by examiner

*Primary Examiner*—David Nhu
(74) *Attorney, Agent, or Firm*—Peter K. McLarty; W. James Brady, III; Frederick J. Telecky, Jr.

(57) ABSTRACT

A method (40) of forming an integrated circuit (60) device including a substrate (64). The method including the step of first (42), forming a gate stack (62) in a fixed relationship to the substrate, the gate stack including a gate having sidewalls. The method further includes the step of second (42), implanting source/drain extensions (70$_1$, 70$_2$) into the substrate and self-aligned relative to the gate stack. The method further includes the steps of third (46, 48), forming a first sidewall-forming layer (72) in a fixed relationship to the sidewalls and forming a second sidewall-forming layer (74) in a fixed relationship to the sidewalls. The step of forming a second sidewall-forming layer includes depositing the second sidewall-forming layer at a temperature equal to or greater than approximately 850° C. The method further includes the step of fourth (50), implanting deep source/drain regions (76$_1$, 76$_2$) into the substrate and self-aligned relative to the gate stack and the first and second sidewall-forming layers.

18 Claims, 4 Drawing Sheets

US 6,743,705 B2

TRANSISTOR WITH IMPROVED SOURCE/DRAIN EXTENSION DOPANT CONCENTRATION

This application claims priority under 35 USC §119(e)1 of provisional application Serial No. 60/338,109, filed Dec. 6, 2001.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to electronic circuit transistors having source/drain extensions.

Semiconductor devices are prevalent in all aspects of electronic circuits, and the design of such circuits often involves a choice from various circuit elements such as one or more different transistor devices. For example, in various applications including many high performance applications, transistors are formed with regions that are sometimes referred to either as drain extensions or source/drain extensions, where either name is used because the region extends the source/drain of the transistor to the area under the transistor gate. Several years ago such extensions were formed in some applications using "lightly-doped drain" extensions, typically identified with the abbreviation LDD. More recently, a comparable structure also extending under the gate channel has been formed, but the amount of dopant concentration in what formerly were the LDD extensions has increased. As a result, these regions are more recently referred to as HDD extensions due to the higher dopant concentration. For the sake of a consistent explanation in this document, all such regions will be referred to generally as source/drain extensions.

By way of further background, the following Figures and discussion illustrate one prior art approach for forming a MOS transistor that includes source/drain extensions, and by way of example a PMOS transistor is shown with it understood that various comparable aspects may implemented with respect to an NMOS transistor. Looking to FIG. 1a, it illustrates a cross-sectional view of a prior art integrated circuit semiconductor device designated generally at 10 and which is built in connection with a substrate 12. By way of example, substrate 12 is a p-type semiconductor material with an n-type well 12' formed in substrate 12. Relative to n-type well 12' (and substrate 12), a gate stack 14 is formed with a gate insulator 16 separating a gate 18 from n-type well 12'. Generally, gate stack 14 is etched from a stack of layers (not shown) formed over n-type well 12' that include an oxide layer adjacent pntype well 12' and a polysilicon layer adjacent the oxide layer. Typically, when gate stack 14 is etched through those layers, most or all of the oxide layer is removed outside of the area of gate stack 14. Thereafter, a first insulating layer 20 is formed over gate stack 14, where first insulating layer 20 is typically oxide. Next, a p-type (e.g., boron) dopant implant is performed into device 10. As a result, this p-type implant forms source/drain extensions 22₁ and 22₂ within n-type well 12' and self-aligned with respect to the thickness of insulating layer 20 where it is along the sidewalls of gate 18.

FIG. 1b illustrates device 10 after the formation steps shown in FIG. 1a, and additionally in FIG. 1b a first anneal is performed. The annealing step activates the dopants in source/drain extensions 22₁ and 22₂ shown in FIG. 1a, and this annealing thereby causes the dopants in those extensions to migrate laterally; thus, in FIG. 1b, source/drain extensions 22₁ and 22₂ from FIG. 1a are labeled 22₁' and 22₂' so as to distinguish them from their form prior to the anneal. Note that source/drain extensions 22₁' and 22₂' extend under gate 18 (i.e., into the transistor channel). The anneal step may be achieved using various parameters, such as a rapid thermal anneal ("RTA") at a temperature on the order of 900° C. After the anneal, a second insulating layer 24 is formed. Typically, second insulating layer 24 is an oxide layer deposited as a conformal layer, which may be accomplished by way of example using a TEOS approach as known in the art. Such an approach commonly uses a deposition temperature on the order of 600 to 650° C. Lastly, a third insulating layer 26 is formed. Typically, third insulating layer 26 is a nitride layer, also deposited as a conformal layer. Such an approach commonly uses a deposition temperature on the order of 700 to 750° C.

FIG. 1c illustrates device 10 after the steps of FIG. 1b, and additionally in FIG. 1c an etch is performed with respect to nitride layer 26, and insulating layers 20 and 24; the resulting portions of these layers are labeled 26', 20', and 24', respectively, so as to distinguish them from their form in FIG. 1b. As a result of the etch, the combination of portions 26', 20', and 24' form sidewall spacers along the sidewalls of gate 18. The etch also exposes the upper surface of n-type well 12' beyond the area covered by the sidewall spacers and gate stack 14. Once the sidewall spacers of FIG. 1c are formed, then a p-type dopant (e.g., boron) is implanted into device 10. This p-type implant may be achieved using various process parameters. The p-type implant forms deep source/drain regions 28₁ and 28₂ self-aligned with respect to the sidewall spacers of gate 18.

FIG. 1d illustrates device 10 after the steps of FIG. 1c, and additionally in FIG. 1d a second anneal is performed. The second annealing step activates the dopants implanted to form deep source/drain regions 28₁ and 28₂ shown in FIG. 1c. In response to the anneal, the dopants in deep source/drain regions 28₁ and 28₂ of FIG. 1c midgrate laterally and they also further combine with source/drain extensions 22₁' and 22₂'. For the sake of distinction, the laterally-migrated deep source/drain regions in FIG. 1d are labeled 28₁' and 28₂'. The second anneal step may be achieved using various parameters, such as an RTA on the order of 950 to 1100° C. and for a desirable amount of time. Lastly, following the preceding steps, various other steps may be taken to form other aspects with respect to the NMOS transistor, including other layers for connectivity and the like.

While device 10 performs adequately in many circuits and applications, it has been observed in connection with the present inventive embodiments that device 10 may provide certain drawbacks. For example, the present inventors have observed increased electrical resistance relating to the transistor channel. Such resistance undesirably reduces the transistor drive current and, thus, can be a drawback for various applications. The present inventors have therefore studied the dopant profile of source/drain extensions 22₁' and 22₂' to determine if the profile may be altered to improve the resistance characteristics of those regions and thereby improve the transistor drive current. In addition, the present inventors have examined the above-described process flow to determine if it may be improved.

In connection with a further analysis of the prior art, FIG. 2 illustrates a plot 30 of the dopant profile for either of source/drain extensions $22_1'$ and $22_2'$ of the prior art device 10. Plot 30 is not drawn to precise scale but instead is sketched to illustrate various aspects now described. Looking to FIG. 2 in greater detail, its vertical axis identifies dopant concentration which begins at a zero concentration point $y_0$ and increases in a logarithmic fashion up the vertical axis, and its horizontal axis illustrates depth into n-type well 12', starting at its surface $x_0$ and moving into n-type well 12' toward the right along the horizontal axis. Generally, therefore, it may be seen from plot 30 that dopant concentration is larger toward the surface of n-type well 12' and then decreases at greater depths within n-type well 12'. However, two aspects are illustrated by plot 30 that cause drawbacks and that are also later described in connection with the preferred embodiments. As a first observation, note that at depth $x_0$ the dopant concentration is at $y_1$, whereas at depth $x_1$ the dopant concentration is larger at a value $y_2$; in other words, at or just below the surface (i.e., at or just past $x_0$), there is actually a reduced amount of dopant concentration $y_1$ as opposed to the dopant concentration $y_2$ existing at depth $x_1$. Such a result is generally undesirable because it gives rise to less than optimal performance, such as increasing the resistance of the source/drain extensions and thereby reducing drive current. As a second observation, note that after the dopant concentration begins to fall at depths greater than $x_1$, the curve is fairly smooth from $x_1$ to $x_2$; however, at $x_2$, the slope of the curve flattens, thereby creating an area in the curve which is sometimes referred to as the tail. In other words, if the curve were to maintain its drop-off after $x_2$, then the concentration would fall to a negligible value at approximately $x_3$, as shown by a theoretical dotted line extending to $x_3$. Instead, however, the tail indicates that dopant concentration remains non-negligible at a depth greater than $x_3$, that is, the dopants extend at least to $x_4$. This additional dopant concentration toward $x_4$ also may produce undesirable operation of the transistor. For example, this dopant concentration may permit current leakage between respective source/drain extensions at a region that is relatively deep in the well, that is, below the intended area of the transistor channel.

In view of the above, there arises a need to address the drawbacks of the prior art, as is achieved by the preferred embodiments described below.

BRIEF SUMMARY OF THE INVENTION

In the preferred embodiment, there is a method of forming an integrated circuit device comprising a substrate. The method comprises the step of first, forming a gate stack in a fixed relationship to the substrate, the gate stack comprising a gate having sidewalls. The method further comprises the step of second, implanting source/drain extensions into the substrate and self-aligned relative to the gate stack. The method further comprises the steps of third, forming a first sidewall-forming layer in a fixed relationship to the sidewalls and forming a second sidewall-forming layer in a fixed relationship to the sidewalls. The step of forming a second sidewall-forming layer comprises depositing the second sidewall-forming layer at a temperature equal to or greater than approximately 850° C. The method further comprises the step of fourth, implanting deep source/drain regions into the substrate and self-aligned relative to the gate stack and the first and second sidewall-forming layers. Other aspects are also disclosed and claimed.

DETAILED DESCRIPTION OF THE INVENTION

FIGS. 1a through 1d and 2 were discussed above in the Background Of The Invention section of this document and the reader is assumed familiar with the principles of that discussion.

Figure 3:
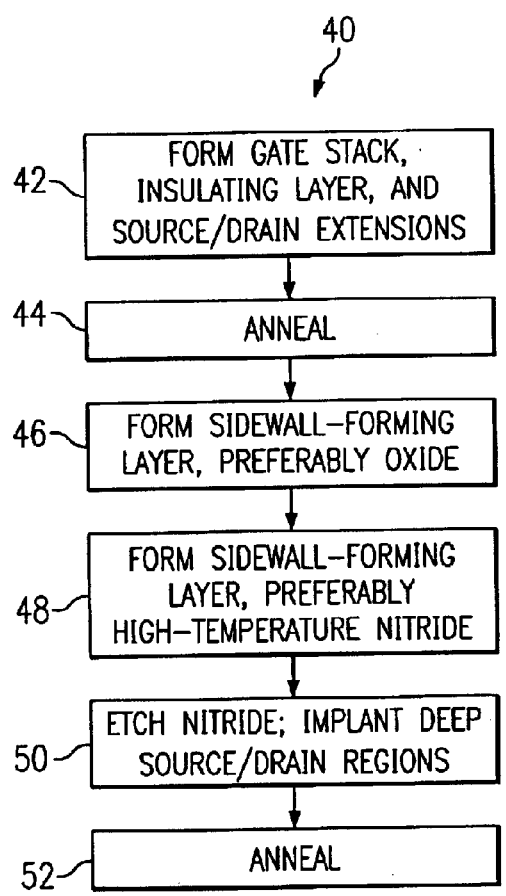
FIG. 3 illustrates a flow chart of a method for forming a transistor according to a preferred embodiment.

FIG. 3 illustrates a flow chart of a method designated generally at 40 and for forming a transistor according to a preferred embodiment. By way of example, the transistor that is described below is a PMOS transistor, while one skilled in the art should recognize that a comparable process, using certain complementary materials, may be used to apply the inventive teachings toward forming an NMOS transistor. Also in this regard, and as detailed later, the following inventive teachings may prove more beneficial in a PMOS implementation as opposed to an NMOS implementation. In any event, for the sake of further appreciating the discussion, FIGS. 4a through 4f illustrate corresponding cross-sectional views of the device as it is constructed according to method 40. By way of introduction to both method 40 and the resulting device, note that in the general sense illustrated in FIGS. 4a through 4f, the transistor shown therein appears in many respects to resemble the prior art. However, as concluded later, the steps in forming that transistor differ and, as a result, so does the profile of the dopant concentration in the transistor's source/drain extensions, but FIGS. 4a through 4f do not illustrate this difference since they relate generally to the approximate physical structure rather than its dopant concentrations. Instead, the resulting dopant concentration is discussed later with respect to FIG. 5.

Figure 4A:
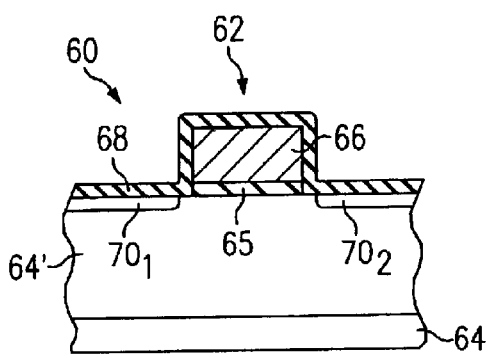
FIG. 4a illustrates a cross-sectional view of an integrated circuit semiconductor device including a PMOS gate stack, an overlying insulating layer, and implanted source/drain extensions according to the preferred embodiment.

Turning to method 40 of FIG. 3 and the cross-sectional view of a corresponding integrated circuit device 60 in FIG. 4a, method 40 commences with a step 42 wherein a gate stack 62 is formed over an n-type well 64' that is formed in a semiconductor substrate 64. Thus, gate stack 62 is fixed in position relative to both substrate 64 and well 64', as are additional features described below and located with respect to gate stack 62. Gate stack 62 preferably includes a gate insulator 65 that separates a gate conductor 66, preferably patterned from polysilicon, from n-type well 64'. Gate stack 62 may be formed using various techniques known in the art. Next, step 42 forms an insulating layer 68 over gate stack 62, for example by performing a re-oxidation of device 60. The re-oxidation causes the formation of an oxide along the exposed semiconductor components and, thus, along polysilicon gate 66 and the upper surface of n-type well 64'. Next, a p-type (e.g., boron) dopant implant is performed into device 60. As a result, this p-type implant forms source/drain extensions $70_1$ and $70_2$ within substrate 64 and self-aligned with respect to the thickness of insulating layer 68 where it is along the sidewalls of gate 66. Note that because the p-type implant in this example passes through the horizontal portions of insulating layer 68 and into the upper surface of n-type well 64', then in the art such an implant is sometimes referred to as an implant through oxide. Alternatively, and not shown, insulating layer 68 could be etched prior to this implant to leave insulating sidewall spacers along the sidewalls of gate 66, with the implant then made to self-align to those sidewall spacers. In any event, following step 42, method 40 continues to step 44.

Figure 4B:
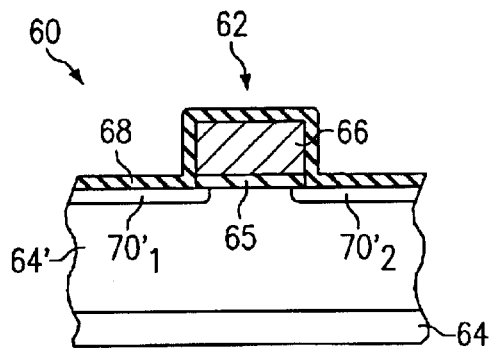
FIG. 4b illustrates the semiconductor device of FIG. 4a after an anneal of the source/drain extensions.

Turning to step 44 of method 40 of FIG. 3 and the cross-sectional view of device 60 in FIG. 4b, in step 44 a first anneal is performed. The annealing step activates the dopants in source/drain extensions $70_1$ and $70_2$ shown in FIG. 4a, and this annealing step thereby causes the dopants in those extensions to migrate laterally. In FIG. 4b, source/drain extensions $70_1$ and $70_2$ from FIG. 4a are labeled $70_1'$ and $70_2'$ so as to distinguish them from their form prior to the anneal. Note therefore that source/drain extensions $70_1'$ and $70_2'$ extend under gate 66 and, thus, into the transistor channel. The anneal step may be achieved using various parameters, such as a rapid thermal anneal ("RTA") at a temperature on the order of 900° C. The duration of the anneal may range from 0.1 to 60 seconds. After the anneal, method 40 continues to step 46.

Figure 4C:
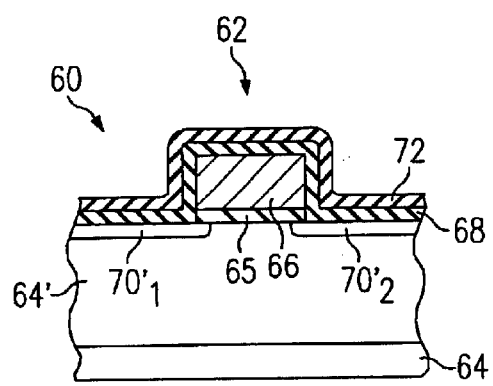
FIG. 4c illustrates the semiconductor device of FIG. 4b after the formation of a sidewall-forming layer.

Turning to step 46 of method 40 of FIG. 3 and the cross-sectional view of device 60 in FIG. 4c, in step 46 a sidewall-forming layer 72 is formed. In the preferred embodiment, sidewall-forming layer 72 is an oxide layer deposited as a conformal layer, which may be accomplished by way of example using a TEOS approach as known in the art. In a first embodiment, the oxide deposition uses a temperature on the order of 600 to 650° C., although a different embodiment is detailed later implementing a higher temperature for this step. After sidewall-forming layer 72 is formed, method 40 continues to step 48.

Figure 4D:
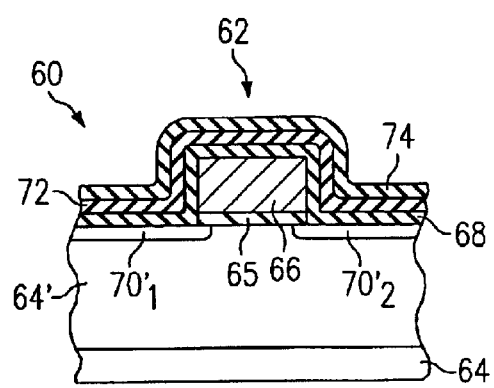
FIG. 4d illustrates the semiconductor device of FIG. 4c after the formation of an additional and hi-temperature sidewall-forming layer.

Turning to step 48 of method 40 of FIG. 3 and the cross-sectional view of device 60 in FIG. 4d, in step 48 an additional sidewall-forming layer 74 is formed. In the preferred embodiment, sidewall-forming layer 74 is a nitride layer, deposited as a conformal layer. In the preferred embodiment, note that the deposition of the nitride to form sidewall-forming layer 74 is achieved using temperatures higher than in the prior art; specifically, in the preferred embodiment, the nitride deposition uses a temperature on the order of approximately 850 to 950° C., as this range has been investigated in the preferred embodiment to achieve benefits over the prior art as detailed later. In addition, the time required for the deposition using this preferred temperature range is on the order of 15 seconds to 2 minutes, which is less than what would be required in the prior art since the prior art uses a lower deposition temperature thereby requiring a greater deposition time. After sidewall-forming layer 74 is formed, method 40 continues to step 50.

Figure 4E:
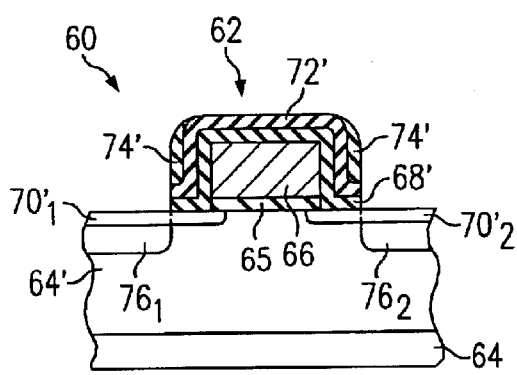
FIG. 4e illustrates the semiconductor device of FIG. 4d after an etch of the insulating and sidewall-forming layers and the implant of deep source/drain regions.

Turning to step 50 of method 40 of FIG. 3 and the cross-sectional view of device 60 in FIG. 4e, in step 50 various actions are taken. First, an etch is performed with respect to the sidewall-forming layer 72 and 74 (oxide and nitride, respectively), as well as with respect to insulating layer 68 which therefore also assists in the formation of a sidewall; the resulting portions of these layers are labeled 72', 74', and 68', respectively, so as to distinguish them from their form in FIG. 4d. As a result of the etch, the combination of portions 72', 74', and 68' form sidewall spacers along the sidewalls of gate 66. The etch also exposes the upper surface of n-type well 64'. Once the sidewall spacers of FIG. 4e are formed, then a p-type dopant (e.g., boron) is implanted into device 60. This p-type implant may be achieved using various process parameters. The p-type implant forms deep source/drain regions $76_1$ and $76_2$ self-aligned with respect to the sidewall spacers of gate 66. Next, method 40 continues to step 52.

Figure 4F:
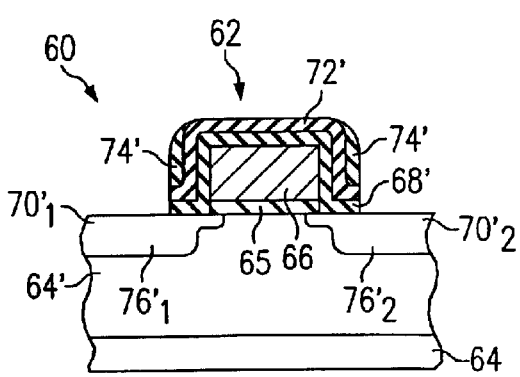
FIG. 4f illustrates the semiconductor device of FIG. 4e after an anneal of the deep source/drain regions.

Turning to step 52 of method 40 of FIG. 3 and the cross-sectional view of device 60 in FIG. 4f, in step 52 a second anneal is performed. The second annealing step activates the dopants implanted to form deep source/drain regions $76_1$ and $76_2$ shown in FIG. 4e; in response to the anneal, the dopants in deep source/drain regions $76_1$ and $76_2$ of FIG. 4f migrate laterally and they also further combine with source/drain extensions $70_1'$ and $70_2'$. For the sake of distinction, the laterally-migrated deep source/drain regions in FIG. 4f are labeled $76_1'$ and $76_2'$. The second anneal step may be achieved using various parameters, such as a rapid thermal anneal on the order of 950 to 1100° C. The duration of the anneal may range from 0.1 to 60 seconds. Lastly, following the preceding steps, various other steps may be taken to form other aspects with respect to the PMOS transistor, including other layers for connectivity and the like.

Figure 1A:
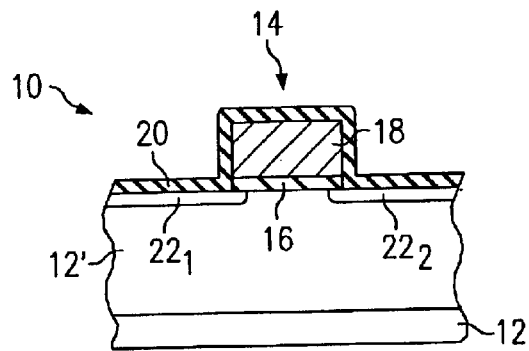
FIG. 1a illustrates a cross-sectional view of a prior art integrated circuit semiconductor device including a PMOS gate stack, an overlying insulating layer, and implanted source/drain extensions.
Figure 1B:
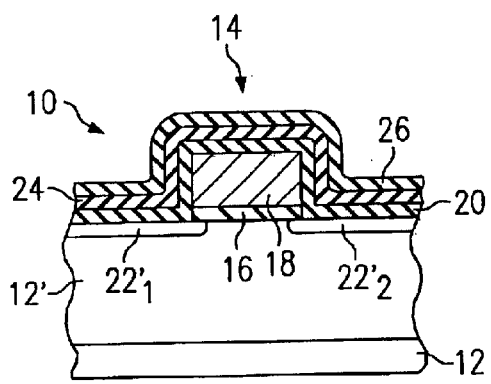
FIG. 1b illustrates the prior art semiconductor device of FIG. 1a after an anneal of the source/drain extensions and the formation of additional oxide and nitride layers.
Figure 1C:
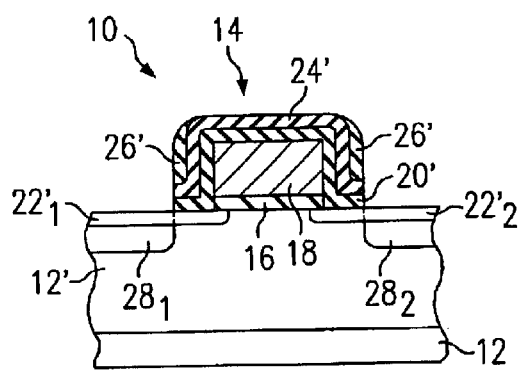
FIG. 1c illustrates the prior art semiconductor device of FIG. 1b after an etch of the insulating, oxide, and nitride layers and an implant of deep source/drain regions.
Figure 1D:
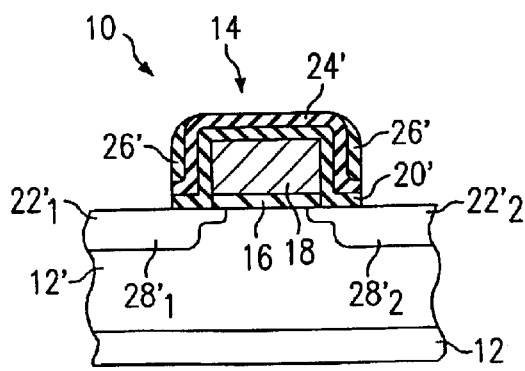
FIG. 1d illustrates the prior art semiconductor device of FIG. 1c after an anneal of the deep source/drain regions.
Figure 2:
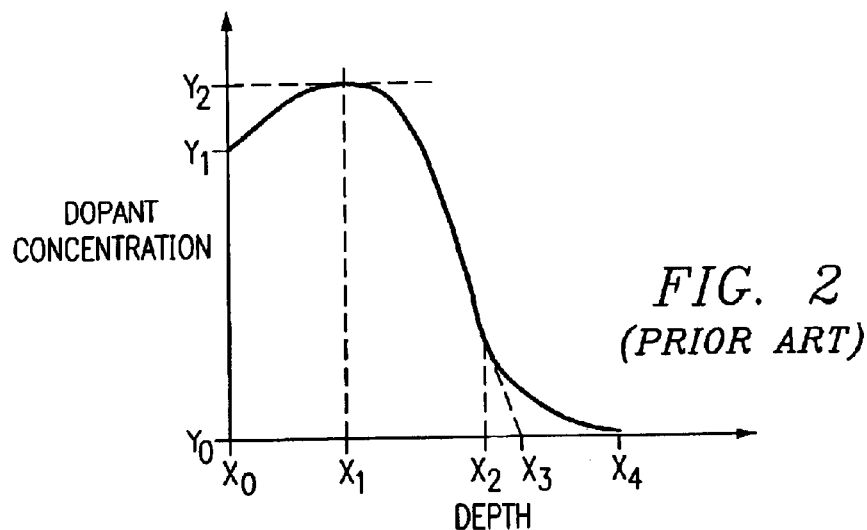
FIG. 2 illustrates a plot of the dopant concentration of the source/drain extensions of the prior art.

FIG. 5 again illustrates plot 30 from FIG. 2 along with the points $x_0$, $x_1$, $x_2$, $x_3$, and $x_4$ described with respect to that plot, but FIG. 5 also illustrates an additional plot 80 of the dopant concentration of source/drain extensions $70_1'$ and $70_2'$ that result from the preferred embodiment described above with respect to method 40 and device 60. Plot 80 is also not drawn to precise scale but instead is sketched to illustrate various aspects of the preferred embodiment and for sake of contrast to plot 30. In any event, at least two differences arise between plots 30 and 80, giving rise to benefits from plot 80 and, thus, as realized by device 60 in comparison to prior art device 10. For the sake of convenience, each of these differences is described separately, below.

Figure 5:
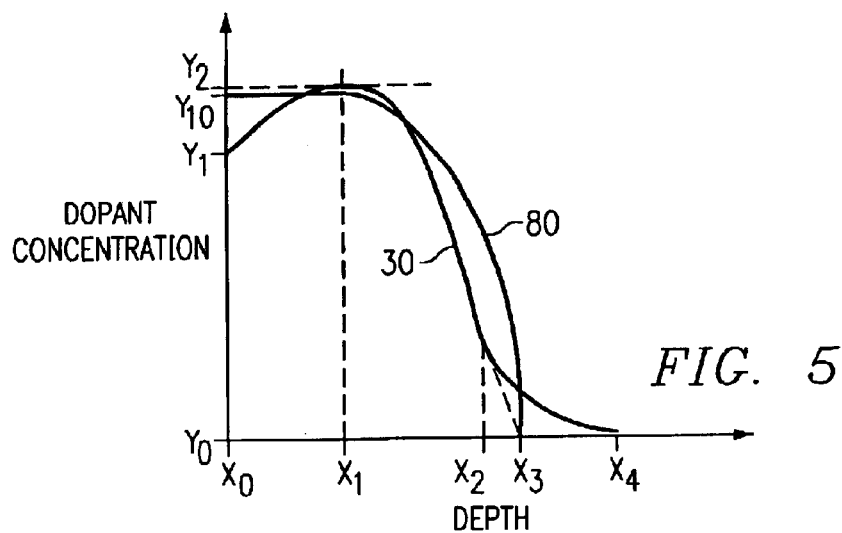
FIG. 5 illustrates a plot of the dopant concentration of the source/drain extensions of the preferred embodiment in contrast to the plot of the dopant concentration of the source/drain extensions of the prior art.

As a first difference between plots 30 and 80 in FIG. 5, attention is directed to the different dopant concentrations for the two plots at the surface of each respective well 12' and 64' (i.e., at $x_0$). Particularly, recall that prior art source/drain extensions $22_1'$ and $22_2'$ have a dopant concentration of $y_1$ at that surface location. In contrast, source/drain extensions $70_1'$ and $70_2'$ of the preferred embodiment have a dopant concentration, $y_{10}$, which is greater than $y_1$. Indeed, $y_{10}$ is at or just below the value of $y_2$, that is, the value of the peak concentration for the prior art source/drain extensions $22_1'$ and $22_2'$. Note, therefore, that the peak source/drain extension concentration for the preferred embodiment occurs at the surface of well 64', whereas in the prior art the peak source/drain extension concentration is at a greater depth below the surface of well 12'. This difference is achieved through the combination of steps in method 40, with certain emphasis on the increased temperature used to form sidewall-forming layer 74. To better appreciate this aspect, first recall in the prior art that after source/drain extensions $22_1$ and $22_2$ are implanted, a first anneal is performed, followed by the formation of layers 20 and 24, the conventional formation of the typically nitride third insulating layer 26, the implant of deep source/drain regions $28_1$ and $28_2$, and then followed by a second anneal. As a result, source/drain extensions $22_1$ and $22_2$ experience two different anneals. In addition, it is believed that the conventional formation of nitride third insulating layer 26 is driving the dopants in source/drain extensions $22_1$ and $22_2$ upward rather than downward, that is, part of their dopant concentration is migrating into first insulating layer 20 (and any residual oxide, if any, left from the formation of gate insulator 16). In other words, the first anneal of source/drain extensions $22_1$ and $22_2$ is not sufficient to fully activate and diffuse those dopants and, thus, they migrate upward during the formation of nitride third insulating layer 26. Thereafter, in response to the second anneal, there is less dopant concentration in well 12' than prior to the upward migration and, hence, following that anneal there is less dopant concentration in source/drain extensions $22_1'$ and $22_2'$. Accordingly, since those dopants move upward, they are no longer within well 12' at its surface, thereby explaining the lower amount of dopants at $x_1$ in comparison to $x_2$. In contrast, in the preferred embodiment, recall that step 48 forms sidewall-forming layer 74 (e.g., nitride) at a temperature higher than used in the prior art to form its sidewall-forming nitride. Thus, in the preferred embodiment, the additional temperature in step 48 not only assists in the deposition of the preferably nitride sidewall-forming layer 74, but it also further activates and diffuses the dopants in the previously-implanted source/drain extensions $70_1$ and $70_2$ and drives them deeper into well 64' and, thus, prevents or reduces any upward migration of those dopants into any insulating layer on top of well 64'. As a result, when the later anneal occurs in step 52, extensions $70_1$ and $70_2$ have already been activated and diffused to a greater and deeper extent than in the prior art. Accordingly, the dopant concentration from source/drain extensions $70_1'$ and $70_2'$ is larger at the surface of well 64' than is the dopant concentration from source/drain extensions $22_1'$ and $22_2'$ at the surface of well 12'. In addition, by reducing the upward migration of dopants as described above, the total amount of dopants from source/drain extensions $70_1'$ and $70_2'$ that remain within well 64' are larger than the total amount of dopants from source/drain extensions $22_1'$ and $22_2'$ that remain within well 12'.

As a second difference between plots 30 and 80 in FIG. 5, recall that plot 30 includes a tail which begins at a depth of approximately $x_2$ into well 12'. In contrast, plot 80 exhibits either a reduced amount of such a tail or no tail, meaning the dopant concentration gradient, as relating to the source/drain extensions, is less pronounced at greater depths into well 64' as compared to well 12'. The present inventors believe that the prior art tail is originally created in response to the implant of source/drain extensions $22_1$ and $22_2$ followed by a TEOS deposition for second insulating layer 24 and a mid-temperature (e.g., 600–700° C.) deposition for nitride insulating layer 26, that is, these processes result in transient enhanced diffusion ("TED") resulting in a tail. Thereafter, the anneal step is performed at a heat which is insufficient to correct all the damage and thereby leaves some of the tail effect. However, in the preferred embodiment, after source/drain extensions $70_1$ and $70_2$ are implanted, there is an anneal step 44 which thereby applies heat to those extensions, and thereafter there also is the step 48 high-temperature deposition of the second sidewall forming layer 74. Thus, the high temperature implemented during step 48 reduces or eliminates any TED and further corrects damage caused by the implant of source/drain extensions $70_1$ and $70_2$, thereby reducing the likelihood of a tail in plot 80.

Figure 6:
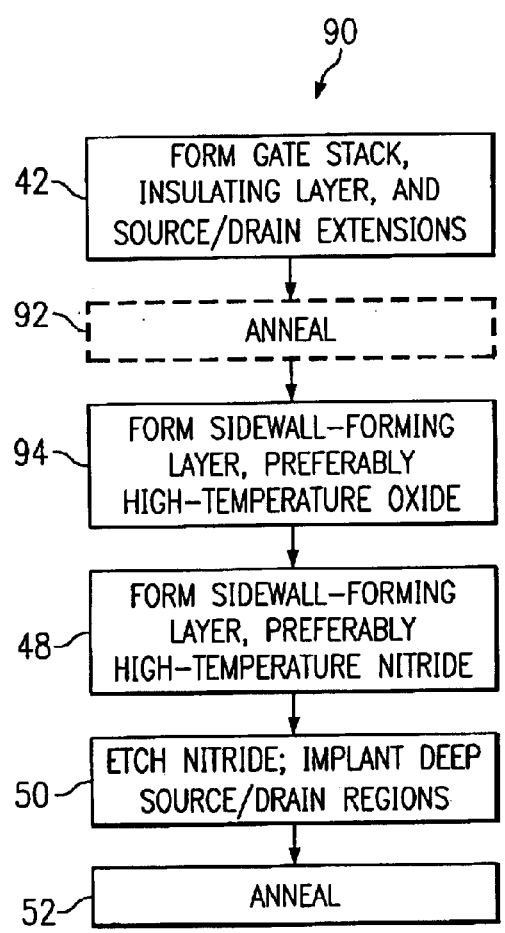
FIG. 6 illustrates a flow chart of a method for forming a transistor according to an alternative preferred embodiment.

FIG. 6 illustrates a flow chart of an alternative method designated generally at 90 and for forming an alternative transistor according to the preferred embodiment. Method 90 shares many of the same steps of method 40 described above with respect to FIG. 3, and to identify these common steps they are designated with the same reference number identifiers in both FIGS. 3 and 6. Further, the reader is assumed familiar with the preceding discussion of those steps and that discussion is not repeated in great detail in connection with FIG. 6. Instead, the following discussion focuses on the differences between methods 40 and 90. Also, a transistor constructed according to method 90 has many of the same general attributes of one constructed according to method 40 and, therefore, there is not a repeat of cross-sectional views of such a transistor.

Turning to method 90, it begins with the same step 42 which forms a gate stack and an insulating layer 68, and it also implants source/drain extensions $70_1$ and $70_2$. Next, method 90 continues to step 92. Step 92 is the same as step 44 of FIG. 3, but is numbered differently in FIG. 6 and is shown in a dotted box because it is optional in the alternative embodiment. In other words, following step 42 of method 90, a first anneal in step 92 may be performed, such as using the temperature and duration set forth above with respect to step 44. However, for reasons described below, this anneal step may be eliminated in some instances. Thereafter, method 90 continues to step 94.

Turning to step 94 of method 90, sidewall-forming layer 72 is formed in the same sequence of flow as in the case of step 46 described above and preferably as an oxide layer deposited as a conformal layer. In this alternative preferred embodiment, however, the temperature of the oxide deposition is increased over that of step 46; for example, a preferred range in the alternative embodiment is on the order of approximately 850 to 950° C. Note therefore that this increased temperature activates the dopants in source/drain extensions $70_1$ and $70_2$ shown in FIG. 4a; for this reason, the separate anneal action of step 92 immediately prior to this step 94 may be eliminated because this step 94 will itself cause the dopants in source/drain extensions $70_1$ and $70_2$ to migrate laterally, thereby forming source/drain extensions $70_1'$ and $70_2'$ in FIG. 4b. Thereafter, method 90 continues to step 48.

The remaining flow of method 90, from step 48 onward, is preferably the same as from step 48 onward of method 40 in FIG. 3. Briefly, therefore, an additional sidewall-forming layer (e.g., nitride) is deposited using a relatively high temperature process, followed by an etch to form sidewall spacers, an implant of deep source/drain regions, and an anneal of the deep source/drain regions. At the conclusion of those steps, note therefore that once again it is anticipated that the dopant concentration of the source/drain extensions will be improved over the prior art. This improvement is again believed to occur in response to the relatively high temperature from step 48, and further in this embodiment due to the relatively high temperature from step 94. In other words, the additional temperature from these steps activates and diffuses the dopants in the source/drain extensions to a greater extent than in the prior art and reduces the chances that those dopants are driven upward and out of well 64' to the extent as in the prior art. Additionally, the increased temperature from these steps further corrects damage due to the TED so there is a reduced tendency for a tail to occur in the dopant profile of those source/drain extensions within substrate 64.

From the above, it may be appreciated that the above provides alternative embodiments for forming a transistor having improved operational characteristics, including a higher dopant concentration at the surface of the transistor in its source/drain extensions and a reduced tendency for those extensions to include a tail in their corresponding dopant concentration profiles at greater depths in the transistor substrate. These differences may provide numerous advantages in the device. For example, the source/drain extension resistance is decreased which increases the transistor drive current. As another example, the possibility of current leakage below the transistor channel is reduced with the reduction in the dopant concentration tail. As another example, by increasing the temperature in the deposition of one or more sidewall-forming layers, the time required to deposit such layers may be reduced, thereby reducing fabrication time. As still another example, one preferred embodiment permits the elimination of an anneal step implemented in the prior art, thereby decreasing the complexity and cost of the method flow. These examples pertaining to improvements in process flow are highly desirable in the rapidly evolving and competitive marketplace for these devices. As still another example, the present inventive teachings may apply to either PMOS transistors as shown, or also to NMOS transistors such as may be formed in a p-type substrate or a p-type well. Also in this regard, however, the present teachings may prove more beneficial in a PMOS transistor because the p-type dopant, boron, tends to segregate into oxide (e.g., layer 20) more than the n-type arsenic or phosphorous, during the nitride and TEOS deposition ambient and temperature; thus, the preferred embodiment is well-suited to overcome the more pronounced actions of the p-type dopant. As a final example, various of the actions taken in the steps described herein, particularly as to aspects of the transistor unrelated to the sidewall spacer, may be altered still further and, thus, the inventive teachings may be applied to create various other transistor devices. Accordingly, these benefits as well as the different approaches described above further serve to demonstrate the inventive scope, and consequently, while the present embodiments have been described in detail, various substitutions, modifications or alterations could be made to the descriptions set forth above without departing from the inventive scope which is defined by the following claims.

What is claimed is:

1. A method of forming an integrated circuit device comprising substrate, the method comprising the steps of:
   first, forming a gate stack in a fixed relationship to the substrate, the gate stack comprising a gate having sidewalls;
   second, implanting source/drain extensions into the substrate and self-aligned relative to the gate stack;
   third, the steps of:
      forming a first sidewall-forming layer in a fixed relationship to the sidewalls;
      forming a nitride sidewall-forming layer in a fixed relationship to the sidewalls, comprising depositing the nitride sidewall-forming layer at a temperature equal to or greater than approximately 850° C.; and
   fourth, implanting deep source/drain regions into the substrate and self-aligned relative to the gate stack and the first and nitride sidewall-forming layers.

2. The method or claim 1 and further comprising, between the second and third steps, the step of annealing the source/drain extensions.

3. The method of claim 2 and further comprising, fifth, annealing the deep source/drain regions.

4. The method of claim 1 wherein the step of forming a first sidewall-forming layer comprises depositing the sidewall-forming layer at a temperature equal to or greater than approximately 850° C.

5. The method of claim 4 wherein the step of forming a first sidewall-forming layer comprises forming an oxide sidewall-forming layer.

6. The method of claim 5 wherein no separate anneal step is performed between-the step of implanting source/drain extensions and the step of forming a first sidewall-forming layer.

7. The method of claim 6 wherein the step of forming the silicon nitride sidewall-forming layer comprises depositing the sidewall-forming layer at a temperature equal to or less than approximately 950° C.

8. The method of claim 7 and further comprising, between the first and second steps, the step of forming an insulating layer along the sidewalls, wherein the source/drain extensions are self-aligned relative to the gate stack by the insulating layer along the sidewalls.

9. The method of claim 8 wherein the first sidewall-forming layer is adjacent portions of the insulating layer along the sidewalls.

10. The method of claim 9 wherein the nitride sidewall-forming layer is adjacent portions of the first sidewall-forming layer along the sidewalls.

11. The method of claim 1 and further comprising, between the first and second steps, the step of forming an insulating layer along the sidewalls, wherein the source/drain extensions are self-aligned relative to the gate stack by the insulating layer along the sidewalls.

12. The method of claim 11 wherein the first sidewall-forming layer is adjacent portions of the insulating layer along the sidewalls.

13. The method of claim 12 wherein the nitride sidewall-forming layer is adjacent portions of the first sidewall-forming layer along the sidewalls.

14. The method of claim 1 wherein the transistor comprises a PMOS transistor.

15. The method of claim 14 the PMOS transistor is formed relative to an n-type well within the substrate.

16. The method of claim 1 wherein the transistor comprises an NMOS transistor.

17. A method of forming an integrated circuit device comprising a substrate, the method comprising the steps of:
   first, forming a gate stack in a fixed relationship to the substrate, the gate stack comprising a gate having sidewalls;
   second, forming an insulating layer along the sidewalls;
   third, implanting source/drain extensions into the substrate, wherein the source/drain extensions are self-aligned relative to the gate stack by the insulating layer along the sidewalls;

fourth, annealing the source/drain extensions;

fifth, the steps of forming a first sidewall-forming layer adjacent portions of the insulating layer along the sidewalls;

forming a nitride sidewall-forming layer adjacent portions of the first sidewall-forming layer along the sidewalls, comprising depositing the nitride sidewall-forming layer at a temperature equal to or greater than approximately 850° C.; and sixth, implanting deep source/drain regions into the substrate and self-aligned relative to the gate stack and the first and nitride sidewall-forming layers; and seventh, annealing the deep source/drain regions.

18. An integrated circuit device comprising a substrate and formed by the steps of:

first, forming a gate stack in a fixed relationship to the substrate, the gate stack comprising a gate having sidewalls;

second, implanting source/drain extensions into the substrate and self-aligned relative to the gate stack;

third, the steps of:

forming a first sidewall-forming layer in a fixed relationship to the sidewalls;

forming a nitride sidewall-forming layer in a fixed relationship to the sidewalls, comprising depositing the nitride sidewall-forming layer at a temperature equal to or greater than approximately 850° C.; and fourth, implanting deep source/drain regions into the substrate and self-aligned relative to the gate stack and the first and nitride sidewall-forming layers.

* * * * *